(12) United States Patent
Gaultier et al.

(10) Patent No.: US 6,178,490 B1
(45) Date of Patent: *Jan. 23, 2001

(54) METHOD AND DEVICE FOR THE INCREMENTAL READING OF A MEMORY

(75) Inventors: Jean-Marie Gaultier, Rousset; Gérard Silvestre De Ferron, Fuveau, both of (FR)

(73) Assignee: SGS-Thomson Microelectronics S.A., Gentilly (FR)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/991,428

(22) Filed: Dec. 16, 1997

(30) Foreign Application Priority Data

Dec. 17, 1996 (FR) .................................. 96 15514

(51) Int. Cl.⁷ ..................................................... G06F 12/00
(52) U.S. Cl. ............................. 711/219; 711/218; 710/52
(58) Field of Search ................................... 711/218, 219, 711/111, 112; 365/233, 221; 710/52; 714/6

(56) References Cited

U.S. PATENT DOCUMENTS

| 4,617,660 | * | 10/1986 | Sakamoto | 714/6 |
| 5,465,343 | * | 11/1995 | Henson et al. | 711/112 |
| 5,745,791 | * | 4/1998 | Peek et al. | 710/52 |
| 5,805,518 | * | 9/1998 | Hashimoto et al. | 365/221 |
| 5,892,730 | * | 4/1999 | Sato et al. | 365/233 |

* cited by examiner

Primary Examiner—Do Hyun Yoo
Assistant Examiner—Nasser Moazzami
(74) Attorney, Agent, or Firm—Wolf, Greenfield & Sacks, P.C.; James H. Morris; Theodore E. Galanthay

(57) ABSTRACT

Disclosed is a method and a device to improve the data output speed of a memory associated with a central processing unit of a microcomputer, should the reading be done at consecutive addresses of the memory in the mode known as the "burst read" mode. The address register is of the type with incrementation controlled by a sequencing circuit. The read register is followed by a data register which records the contents of the read register so as to free this read register to record the contents of the memory cells that are selected by the incremented address.

20 Claims, 3 Drawing Sheets

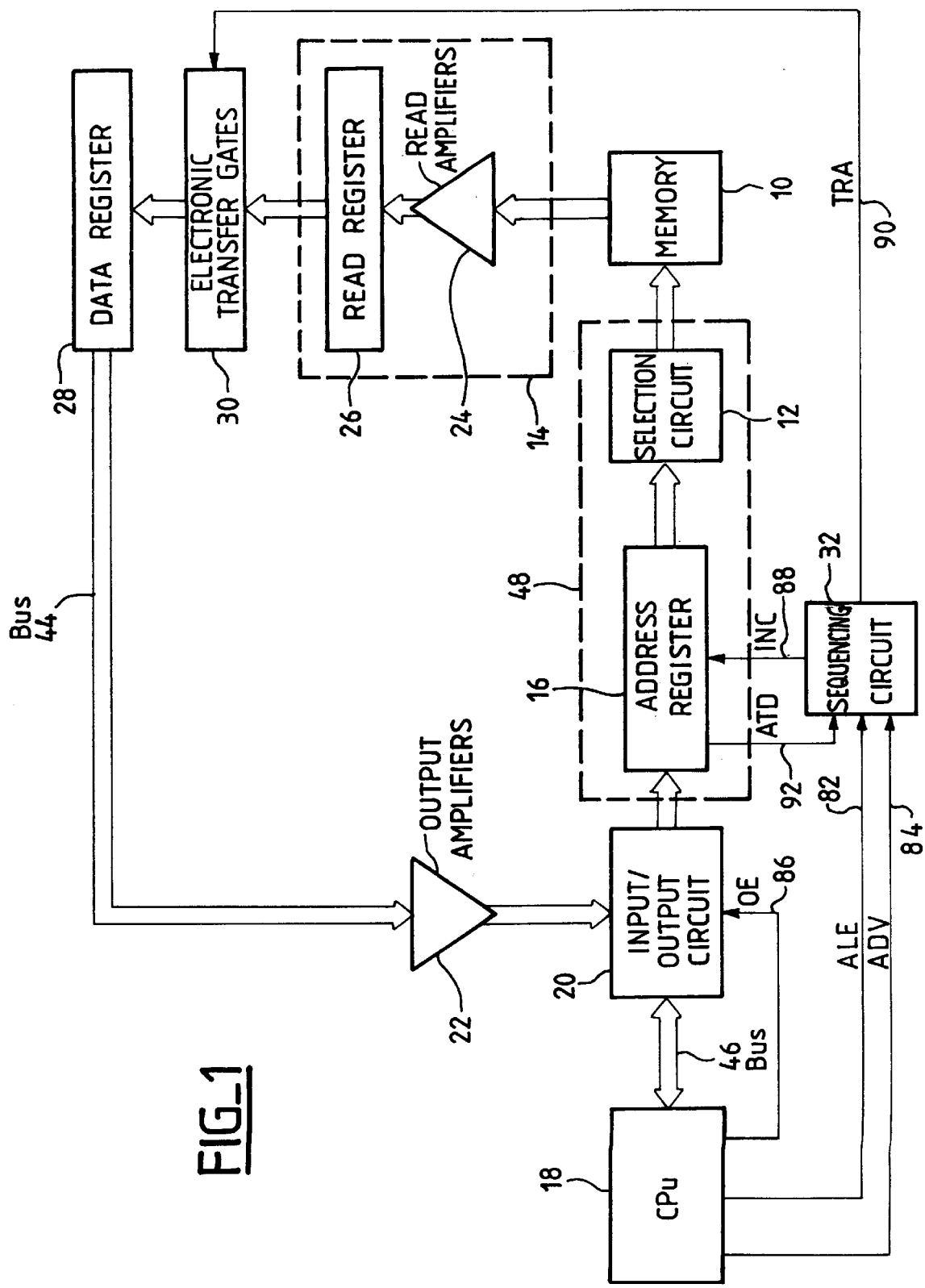
FIG_1

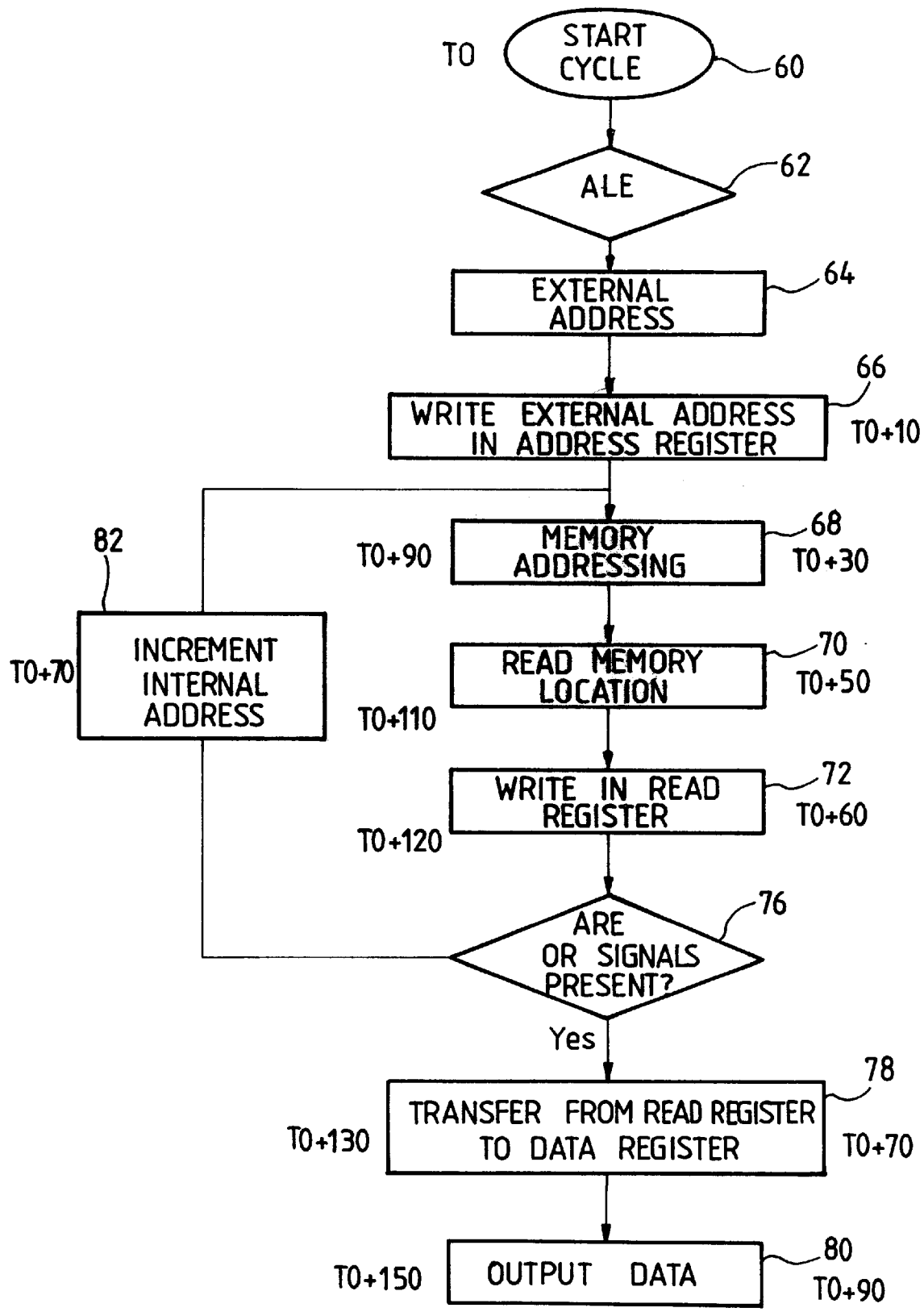
FIG_2

FIG. 3a ALE
FIG. 3b ADV
FIG. 3c ADD/DAT
FIG. 3d OE

METHOD AND DEVICE FOR THE INCREMENTAL READING OF A MEMORY

BACKGROUND OF THE INVENTION

1. Field of the Invention

The invention relates to the memories of the central processing units of microcomputers and more particularly to a method and device for the incremental reading of a memory so as to improve its performance characteristics by increasing the data output speed, should the reading be done at consecutive addresses of the memory in the mode known as the "burst read" mode.

2. Discussion of Related Art

Pieces of data contained in a memory are read by means of addresses or addressing codes that are provided successively to addressing circuits of the memory by the central processing unit of the microprocessor or microcontroller, each addressing code corresponding to a piece of data that is then processed by the central processing unit according to the instruction being executed. In this mode of reading, the pieces of data contained in the memory are read only as and when the addressing codes arrive, the addressing code of the next piece of data to be processed being provided only after the transfer of the previous piece of data into the central processing unit.

This read mode results in idle time during reading of the memory and therefore results in a time delay. This time delay is detrimental to the speed of computation of the central processing unit.

SUMMARY OF THE INVENTION

Therefore, an object of the present invention is to reduce this reading time and thus increase the data output speed.

To achieve this aim, one embodiment of the invention reads a piece of data at an address immediately following the reading of the piece of data contained in the following address, the latter address being obtained by incrementing the previous address by one unit.

Thus, in performing an instruction that uses the pieces of data contained at consecutive addresses of the memory, it is not necessary to wait for the arrival of the addressing code coming from the central processing unit to read the memory at these consecutive addresses.

Should the address given by the central processing unit not correspond to the next address of the memory, the data read at this last address is not transferred to the central processing unit and is therefore not taken into account.

To implement a method according to the invention, the addressing and read circuits of the memory must be modified or added to.

Thus, the read circuits may include, apart from the read register, an additional register called a data register to record the piece of data read and thus free the read register for the reading at the following address and electronic transfer circuits between the read register and the data register to obtain the passage of the data from the read register to the data register.

Furthermore, the addressing register of the memory may be of the incremental type, the incrementation being activated by a signal provided by a sequencing circuit. This sequencing circuit provides another signal furthermore controlling the electronic transfer circuits between the read register and the data register.

The invention therefore relates to a device for the incremental reading of a memory of a central processing unit of a microcomputer with which there are associated circuits for the addressing of the cells of said memory comprising an address register and circuits for the reading of the signals read in the cells of the memory selected by said addressing circuits comprising a first register called a read register in which the signals read are recorded in binary form, wherein the device comprises an incrementation circuit for increasing the contents of the address register by at least one unit so that it addresses the memory cells corresponding to the address that follows the one that it contains, and a storage circuit for recording the contents of the read register so that it can record the signals read in the memory cells corresponding to the next address.

In another embodiment, the incrementation circuit includes a sequencing circuit that is controlled by the signals given by the central processing unit and that provides a signal for the incrementation of the address register.

The storage circuit to record the contents of the read register includes a second register called a data register and electronic transfer circuits that are controlled by a signal provided by the incrementation circuit of the address register.

The invention also relates to a method for the incremental reading of a memory of a central processing unit of a microcomputer with which there are associated circuits for the addressing of the cells of said memory, comprising an address register, and read circuits for the reading of the signals read in the cells of said memory selected by said addressing circuits, comprising a first register called a read register in which the signals read are recorded in binary form, wherein said method comprises the following steps:

a) recording, by the central processing unit, an addressing code in the address register;

b) reading the cells of the memory selected by the addressing code;

c) recording signals read during the step b) in the read register and then in a second register called a data register;

d) transferring the contents of the data register to the central processing unit;

e) incrementing, by at least one unit, the contents of the address register to obtain a new addressing code;

f) reading the memory cells selected by the new addressing code obtained by step e);

g) recording the signals read during the step f) in the read register and then in the data register;

h) transferring the contents of the data register to the central processing unit if the next addressing code corresponds to the address resulting from the step e), and then returning to step e); and i) returning to step a) if the next addressing code does not correspond to the address resulting from step e).

In one embodiment of the method, the incrementing step e) is performed between steps c) and d).

BRIEF DESCRIPTION OF THE DRAWINGS

The invention will shall now be described with reference to a particular embodiment, the description being made with reference to the appended drawings, of which:

FIG. 1 is a functional drawing of a device for the incremental reading of a memory according to one embodiment of the present invention.

FIG. 2 is a diagram of a read cycle according to one method of the invention.

FIGS. 3a to 3d are timing diagrams of signals.

DETAILED DESCRIPTION

In a known way, with a memory 10, there are associated selection circuits 12 that enable the selection of the memory cells and read circuits 14 that enable the "collecting" of the information or pieces of data read in the selected cells. The addresses of the memory cells are provided to the selection circuits 12 by an address register 16 which receives them from a central processing unit 18 by means of an input/output circuit 20 and a two-way bus 46. The selection circuit 12 and the address register 16 constitute addressing circuits 48. This input/output circuit 20 furthermore receives the information or data read in the memory 10 by means of the read circuits 14, output amplifiers 22, and a one-way bus 44.

The read circuits 14 include read amplifiers 24 that amplify the signals read in the selected memory cells and a read register 26 that records or stores the signals read in binary form.

The transfer of the pieces of binary information contained in the read register 26 to the central processing unit 18 is done in the presence of a signal OE given by the processing unit 18 on a conductor 86.

The memory 10 also has circuits for the recording of pieces of data that shall not be described here as the invention pertains only to the reading of the memory 1 0.

According to the invention, the incremental reading device comprises, in addition to the elements described above, a register known as a data register 28 that is connected between the read register 26 and the output amplifiers 22. The input terminals of the data register 28 are connected to the output terminals of the read register 26 by means of electronic circuits or electronic gates 30. The output terminals of the data register 28 are connected to the input/output circuits 20 by means of the output amplifiers 22 and the one-way bus 44.

According to the invention, the address register 16 is of the type with incrementation obtained by a first signal INC given by a sequencing circuit 32 on a conductor 88. The sequencing circuit 32 gives a second signal TRA on a conductor 90 that controls the electronic gate transfer 30.

The sequencing circuit 32 is controlled by signals ALE and ADV which are provided by the processing unit 18 on conductors 82 and 84 respectively. The signal ALE means that the addressing code to be taken into account is the one given by the central processing unit on the bus 46 while the signal ADV means that the addressing code to be taken into account is the one resulting from the incrementation.

The sequencing circuit 32 also receives an address transition detection signal ATD from the address register 16 on a conductor 92. The ATD signal indicates that the addressing code contained in the address register has changed.

The sequencing circuit 32 essentially comprises a clock generator which generates signals at a given frequency and logic circuits for the preparation of the signals INC and TRA.

The working of the device of FIG. 1 is as follows with respect to the diagrams of FIGS. 2 and 3.

At the outset T0 of a read cycle of the memory 10 (ellipse 60), the central processing unit 18 provides the signal ALE (diamond 62) and the addressing code (rectangle 64) of the memory that is recorded at the time (T0+10 ns) in the address register 16. The addressing or selection of the memory location is done at the time (T0+30 ns) by means of the selection circuit 12 (rectangle 68).

The reading of the selected memory location is done at the time (T0+50 ns) (rectangle 70) and the signals read in the read register 26 are recorded or written in binary form in the read register 26 at the time (T0+60 ns) (rectangle 72).

The transfer (signal TRA) of the piece of data from the read register 26 to the data register 28 is done at the time (T0+70 ns) in the presence of a signal ALE corresponding to a new addressing code that does not follow the previous one or a signal ADV indicating that the addressing code is the one that follows the previous one (rectangle 78).

The piece of data contained in the data register 28 is transmitted to the central processing unit 18 by means of the input/output circuit 20 at the time (T0+90 ns) which is controlled by the signal OE of the processing unit 18 (rectangle 80).

In the prior art mode of operation, the following signal ALE and the following addressing code can be taken into account only at this instant.

In the mode according to one embodiment of the invention, as soon as the transfer from the read register 26 to the data register 28 has been done, the read register 26 is free to record the contents of a new memory location, namely at the time (T0+70 ns). At this instant, a signal ADV enables the incrementation (rectangle 82) of the address contained in the address register 16 so that the memory 10 is selected (rectangle 68) at the time (T0+90 ns), the reading (rectangle 70) is done at the time (T0+110 ns), the writing (rectangle 72) in the read register is done at the time (T0+120 ns), the transfer (rectangle 78) into the data register is done at the time (T0+130 ns) and the output (rectangle 80) to the central processing unit is done at the time (T0+150 ns).

The comparison of these different points in time shows that the normal cycle with the signal ALE is equal to 90 ns and that it is 60 ns with the signal ADV corresponding to the next address, giving a gain of one-third.

The diagrams of FIGS. 3-a to 3-d are respectively timing diagrams of the signals ALE, ADV, ADD/DAT and OE, the signal ADD/DAT corresponding either to the transfer of the addressing code ADD from the central processing unit 18 to the address register 16 or to the transfer of the piece of data DAT read in the data register 28 to the central processing unit 18, the transfers being done through the input/output circuit 20 and the two-way bus 46. Digits 0, 1, 2, 3 or the letter J associated with the address ADD or with the piece of data DAT indicate that the address or the piece of data concerned has the rank 0, 1, 2, 3, . . . , J.

The sequence of the operations is as follows:

A) recording the addressing code provided by the central processing unit 18 in the address register 16 in the presence of the signal ALE;

B) addressing the memory 10 to select the cells corresponding to the address contained in the address register 16;

C) reading the selected memory cells;

D) recording the signals read in the selected memory cells in the read register 26;

E) recording the contents of the read register 26 in the data register 28 in the presence of the signal TRA;

F1) transferring the contents of the data register 28 to the central processing unit 18 by means of the input/output circuit 20 in the presence of the signals ALE and OE;

F2) incrementing the address contained in the address register 16;

G) addressing the memory 10 to select the cells corresponding to the incremented address contained in the address register 16;

H) reading the selected memory cells;

I) recording the signals read in the selected memory cells in the read register 26;

J) recording the contents of the read register in the data register 28 in the presence of the signal TRA;

K1) transferring the contents of the data register 28 to the central processing unit 18 by means of the input/output circuit 20 in the presence of the signals ADV and OE;

K2) returning to step F2) in the presence of the signal ADV;

K3) returning to step A) in the presence of the signal ALE.

It must be noted that the steps C) and H) for the reading of the selected memory cells may, depending on the type of memory, include a step for the precharging of the memory cells before their actual reading.

The operations that have just been described may be summarized in the following main steps:

a) recording, by the central processing unit 18, an addressing code in the address register 16;

b) reading the cells of the memory selected by the addressing code;

c) recording the signals read during the step (b) in the read register 26 and then in a data register 28;

d) transferring the contents of the data register to the central processing unit 18;

e) incrementing, by at least one unit, the contents of the address register 16 to obtain a new addressing code;

f) reading the memory cells selected by the new addressing code obtained by step e);

g) recording the signals read during step f) in the read register 26 and then in the data register 28;

h) the transfer of the contents of the data register 28 to the central processing unit 18 if the next addressing code corresponds to the address resulting from step e), and then returning to step e); and i) returning to step a) if the next addressing code does not correspond to the address resulting from step e).

The incrementing step or step e) may be executed as soon as step c) has been perforrned, i.e. as soon as the contents of the read register have been transferred into the data register 28, thus making it possible to gain time and hence increase the speed.

The invention has been described with an incrementation by one unit. However, this incrementation may have any integer value 2, 3, . . . , n.

Having thus described at least one illustrative embodiment of the invention, various modifications and improvements will readily occur to those skilled in the art and are intended to be within the scope of the invention. Accordingly, the foregoing description is by way of example only and is not intended as limiting. The invention is limited only as defined in the following claims and the equivalents thereto.

What is claimed is:

1. A device for incremental reading of a memory of a central processing unit of a microcomputer with which there are associated circuits for addressing of memory cells of said memory, comprising an address register, and circuits for the reading of signals read in the memory cells of said memory selected by said addressing circuits, comprising at least a first register called a read register in which the signals read are recorded in binary form, wherein said device comprises:

incrementation means for increasing contents of the address register by at least one unit so that memory cells are addressed corresponding to an address that follows a memory cell previously read, and storage means for recording the contents of the first read register so that it can record the signals read in the memory cells corresponding to the next address, wherein the incrementation means include a sequencing circuit that is controlled by signals from the central processing unit and that provides an increment signal for incrementation of the address register, wherein the storage means include a second register called a data register, and an electronic transfer circuit between the read register and the data register that is controlled by a control signal provided by the incrementation means.

2. A device according to claim 1, wherein the sequencing circuit operates so as to transfer the then contents of the read register to the data register but only when the incremented address is the same as the new address received from the central processing unit.

3. A device according to claim 1, wherein the central processing unit provides a signal ALE meaning that an addressing code to be taken into account is the one given by the central processing unit and a signal ADV which means that the addressing code to be taken into account is the one resulting from the incrementation.

4. A device according to claim 1, wherein the contents of the read register are transferred to the data register only if the incremented address and the new address from the central processing unit are the same.

5. A method for the incremental reading of a memory of a central processing unit of a microcomputer with which there are associated circuits for the addressing of the cells of said memory comprising an address register and read circuits for the reading of the signals read in the cells of said memory selected by said addressing circuits, comprising a first register called a read register in which the signals read are recorded in binary form, wherein said method comprises the following steps:

a) recording, by the central processing unit, an addressing code in the address register;

b) reading the cells of the memory selected by the addressing code;

c) recording signals read during the step b) in the read register and then in a data register;

d) transferring the contents of the data register to the central processing unit;

e) incrementing, by at least one unit, the contents of the address register to obtain a new addressing code;

f) reading the memory cells selected by the new addressing code obtained by step e);

g) recording of the signals read during step f) in the read register and then in the data register;

h) transferring the contents of the data register to the central processing unit if the next addressing code corresponds to the address resulting from step e), and then returning to step e); and i) returning to step a) if the next addressing code does not correspond to the address resulting from step e).

6. A method of reading according to claim 5, wherein step e) is performed between steps c) and d).

7. A device for incremental reading of a CPU (central processing unit) memory having memory cells and associated addressing circuits for addressing the memory cells, comprising an address register; and reading circuits for reading memory signals in the memory cells selected by the addressing circuit, the reading circuit comprising:
  a read register in which the memory signals are recorded;
  a sequencing circuit coupled to the address register wherein the sequencing circuit provides an increment signal to the address register for incrementing the address register by at least one unit to address a memory cell having a next address; and
  a storage circuit coupled to the read register and receiving at least one memory signal corresponding to the next address;
  wherein the storage circuit includes;
    a data register; and
    an electronic transfer circuit coupled to the read register and the data register,
wherein the electronic transfer circuit receives a control signal from the sequencing circuit;
  wherein the sequencing circuit receives a control signal from the central processing unit.

8. The device according to claim 7, wherein the sequencing circuit operates so as to transfer the then contents of the read register to the data register but only when the incremented address is the same as the new address received from the central processing unit.

9. The device according to claim 7, wherein the central processing unit provides a signal ALE meaning that an addressing code to be taken into account is the one given by the central processing unit and a signal ADV which means that the addressing code to be taken into account is the one resulting from the incrementation.

10. The device according to claim 7, wherein the contents of the read register are transferred to the data register only if the incremented address and the new address from the central processing unit are the same.

11. computer comprising:
  a memory having memory cells;
  a reading circuit for reading signals in the memory cells; and
  associated addressing circuit for selecting the memory cells to be read, the reading circuit comprising:
    a read register in which the memory signals are recorded;
    a sequencing circuit coupled to an address register wherein the sequencing circuit provides an increment signal to a register for incrementing the address register by at least one unit to address a memory cell having a next address; and
    a storage circuit coupled to the read register and receiving at least one memory signal corresponding to the next address;
    wherein the storage circuit includes:
      a data register; and
      an electronic transfer circuit coupled to the read register and the data register, wherein the electronic transfer circuit receives a control signal from the sequencing circuit;
      wherein the sequencing circuit receives a control signal from a central processing unit.

12. The computer according to claim 11, wherein the sequencing circuit operates so as to transfer the then contents of the read register to the data register but only when the incremented address is the same as the new address received from the central processing unit.

13. The computer according to claim 11, wherein the central processing unit provides a signal ALE meaning that an addressing code to be taken into account is the one given by the central processing unit and a signal ADV which means that the addressing code to be taken into account is the one resulting from the incrementation.

14. The computer according to claim 11, wherein the contents of the read register are transferred to the data register only if the incremented address and the new address from the central processing unit are the same.

15. A device for incremental reading of a central processing unit memory comprising:
  an addressing circuit coupled to the memory;
  a sequencing circuit providing an increment signal to the addressing circuit; and a read circuit having an input coupled to an output of the memory;
  wherein the addressing circuit comprises:
    an address register; and
    a selection circuit;
  wherein the read circuit comprises:
    a read register;
    a data register; and
    an electronic transfer circuit coupled to the read register and the data register, wherein the electronic transfer circuit receives a control signal from the sequencing circuit;
  wherein the sequencing circuit receives a control signal from the central processing unit.

16. The device according to claim 15, the addressing circuit comprising:
  an address register; and
  a selection circuit coupled to the memory and the address register.

17. The device according to claim 15, the read circuit comprising: a read amplifier coupled to an output of the memory, wherein the read register receives an amplified memory signal produced by the read amplifier.

18. The device according to claim 15, wherein the electronic transfer circuit receives an output of the read circuit to the data register upon receiving a control signal from the sequencing circuit.

19. The device according to claim 15, wherein the sequencing circuit receives an address translation detection signal provided by the addressing circuit.

20. The device according to claim 15 wherein the sequencing circuit operates so as to transfer the then contents of the read register to the data register but only when the incremented address is the same as the new address received from the central processing unit.

* * * * *